United States Patent [19]
Miyamoto et al.

[11] Patent Number: 5,675,172
[45] Date of Patent: Oct. 7, 1997

[54] METAL-INSULATOR-SEMICONDUCTOR DEVICE HAVING REDUCED THRESHOLD VOLTAGE AND HIGH MOBILITY FOR HIGH SPEED/LOW-VOLTAGE OPERATION

[75] Inventors: Masafumi Miyamoto, Koganei; Tatsuya Ishii, Kodaira, both of Japan

[73] Assignee: Hitachi, Ltd., Tokyo, Japan

[21] Appl. No.: 441,707

[22] Filed: May 15, 1995

[30] Foreign Application Priority Data

May 17, 1994 [JP] Japan .................. 6-101457

[51] Int. Cl.$^6$ .......................... H01L 29/76; H01L 29/94; H01L 31/062
[52] U.S. Cl. .......................... 257/402; 257/392; 257/396; 257/403; 257/404
[58] Field of Search .......................... 257/403, 404, 257/386, 392, 396, 402

[56] References Cited

U.S. PATENT DOCUMENTS 4,276,095  6/1981  Beilstein, Jr. et al. .................. 148/1.5
5,489,795  2/1996  Yoshimura et al. .................. 257/369

FOREIGN PATENT DOCUMENTS

A-60-50960  3/1985  Japan .

OTHER PUBLICATIONS

English language abstract of Japanese publication No. 60–50960 (A), published Mar. 22, 1985.
"Substrate Engineering" for $V_{TH}$-Scaling at Low Supply Voltage (1.3–3V) in USLIs, by R. Izawa et al., Extended Abstracts of 21st Conf. on Solid State Devices and Materials, Tokyo, 1989, pp. 121–124.
"Design and Performance of 0.1µm CMOS Devices ..." by M. Aoki, et al., IEEE Electron Device Letters, vol. 13, No. 1, Jan. 1992, pp. 50–52.

Primary Examiner—Ngân V. Ngô
Attorney, Agent, or Firm—Antonelli, Terry, Stout & Kraus, LLP.

[57] ABSTRACT

A MIS device comprising a pair of first doped layers of a second conductivity type forming source/drain regions in a semiconductor base structure of a first conductivity type, and a gate electrode formed in a region between the first doped layers of the second conductivity type on a gate insulating film formed on the semiconductor base structure having a three-layer structure consisting of a second doped layer of the first conductivity type, a third doped layer of the second conductivity type and a fourth doped layer of the first conductivity type having an impurity concentration higher than that of the semiconductor base structure, which are formed in that order in the direction of depth from the surface of a channel region extending between the source/drain regions, the thickness of the third doped layer is determined so that the third doped layer is depleted by the respective built-in potentials of pn junctions formed by the second doped layer and the third doped layer and by the fourth doped layer and the third doped layer, respectively. Even when the MIS device of this structure is miniaturized, the subthreshold swing can be reduced to a value small enough to enable the lowering of the threshold voltage, the electric field intensity in the interface of the gate insulating film is reduced to enhance the carrier mobility and hence the MIS device is suitable for low-voltage operation.

26 Claims, 9 Drawing Sheets

METAL-INSULATOR-SEMICONDUCTOR DEVICE HAVING REDUCED THRESHOLD VOLTAGE AND HIGH MOBILITY FOR HIGH SPEED/LOW-VOLTAGE OPERATION

BACKGROUND OF THE INVENTION

The present invention relates to a metal-insulator-semiconductor (MIS) device and, more particularly, to a MIS device suitable for low-voltage operation and having an improved subthreshold characteristic to lower the threshold voltage and to improve current driving ability.

Use of lower supply voltage to reduce power consumption and to secure the reliability of MOS transistors has become necessary to deal with the progressive increase in the degree of integration of CMOS (complementary MOS) circuits. At the same time, the lowering of threshold voltage to enable turning on a MOS transistor by a low gate voltage will be necessary as well as the miniaturization of the MOS transistor to secure high operating speed in a low-voltage operation.

On the other hand, in a miniaturized MOS transistor, the impurity concentration of the substrate is as high as about $1 \times 10^{18}$ $cm^{-3}$ to reduce short-channel effect and to suppress punch-through. In a MOS transistor employing a substrate having such a high impurity concentration, a depletion layer does not spread in forming an inversion layer in a channel region, the capacitance of the depletion layer increases and, consequently, subthreshold swing increases. Therefore, the threshold voltage cannot be greatly lowered to suppress leakage current below a desired level. Furthermore, when a substrate having a high impurity concentration is used, the impurity concentration of the channel region is high, the scatter of the impurity is enhanced, the depletion layer does not spread in forming an inversion layer and, consequently, the longitudinal electric field in the interface of a gate insulating film is intensified. Therefore, carrier mobility is reduced.

Figure 2:
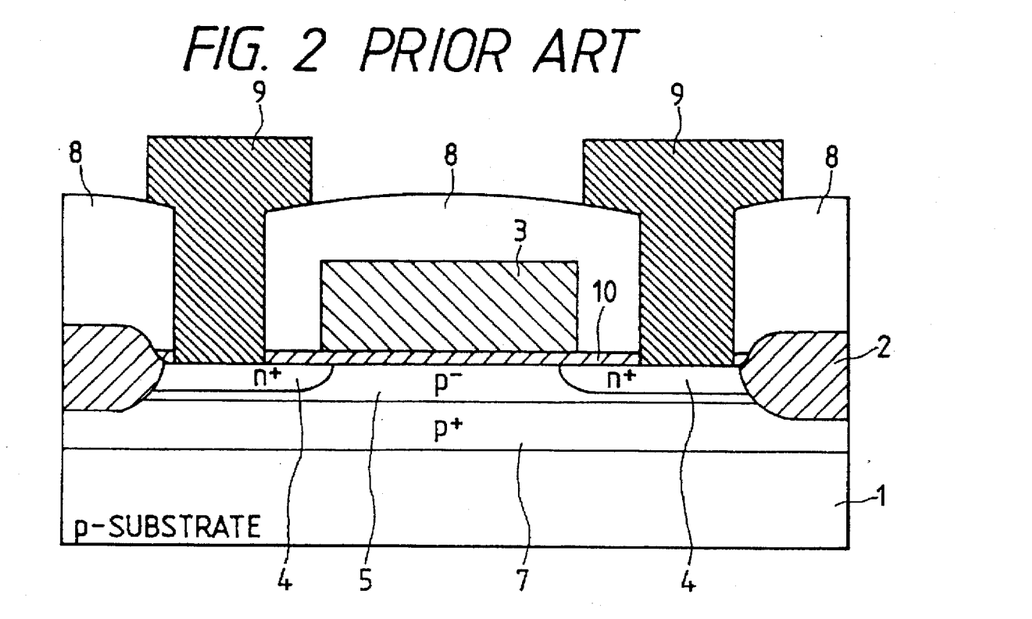
FIG. 2 is a typical sectional view of a conventional MIS device.

As measures to solve such problems, a MIS device of a structure as shown in FIG. 2 is known. This MIS device operates on a low supply voltage in the range of 1.5 to 3 V. Referring to FIG. 2, there are shown a p-type substrate 1, an isolation insulator 2, a gate electrode 3, $n^+$ source/drain regions 4, a lightly doped $p^-$-type doped layer 5, a heavily doped $p^+$-type buried layer 7, an interlayer insulator 8, metal wiring lines 9, and a gate insulating film 10.

In the structure shown in FIG. 2, the heavily doped $p^+$-type buried layer 7 serves as a punch-through stopper to use the p-type substrate 1 having an impurity concentration of about $1 \times 10^{16}$ $cm^{-3}$, the lightly doped $p^-$-type doped layer 5 is formed over the surface of a channel region and is depleted in forming an inversion layer so that the depletion layer spreads to the upper surface of the heavily doped $p^+$-type buried layer 7 to reduce subthreshold swing. This known structure makes the depletion layer spread during channel region formation to reduce the capacitance of the depletion layer. Consequently, the subthreshold swing can be reduced to lower the threshold voltage. At the same time, impurity scattering is reduced because the impurity concentration of the channel region is reduced by the lightly doped $p^-$-type doped layer 5, the reduction of carrier mobility is enhanced by the reduction of the electric field intensity in the interface of the gate insulating film, and high-speed operation is possible.

The lightly doped layer of such a MIS device formed in the surface channel region can be formed by an ion implantation process or a low-temperature epitaxial growth process. An example of the ion implantation process is described in Extended Abstracts of the 21st Conference on Solid State Devices and Materials, Tokyo, 1989, pp. 121–124 and an example of the low-temperature epitaxial growth process is described in IEEE ELECTRON DEVICE LETTERS, Vol. 13, No. 1, pp. 50–52, January, 1992.

In an n-channel MOSFET disclosed in Japanese Patent Laid-open (Kokai) No. 60-50960, a p-type doped layer for avoiding the formation of a surface channel region, an n-type doped layer that serves as a buried layer, and a p-type substrate are arranged in that order from the surface of a channel region between source/drain regions along the depth to enhance carrier mobility and to enable an operation as a buried channel in the entire range of gate voltage.

Figure 3:
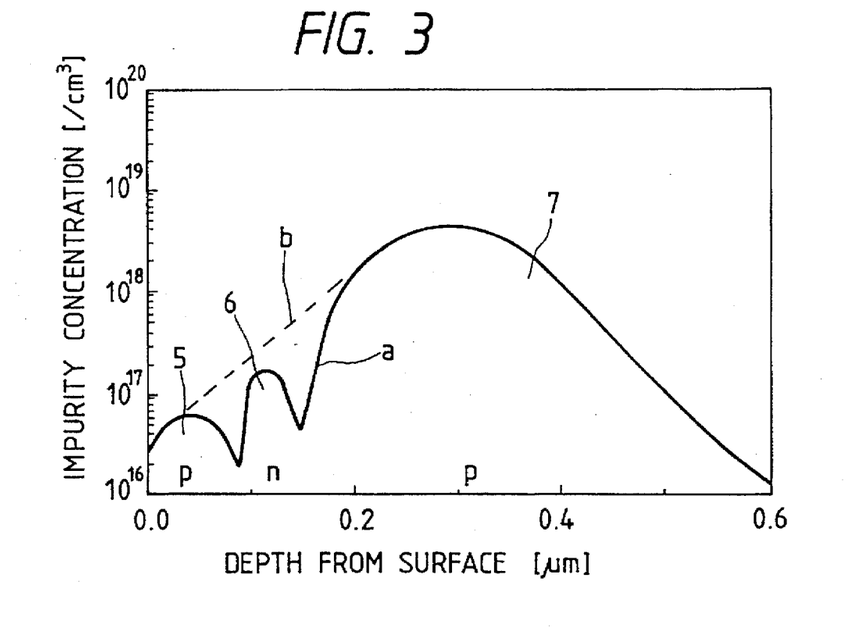
FIG. 3 a graph showing the variation of the impurity concentration with the depth of a channel region from the surface of a substrate for a MIS device in accordance with the present invention and a convention MIS device.

However, when the ion implantation process is employed in forming the structure provided with the lightly doped layer on the surface of the channel region, impurity concentration is distributed over a wide range and hence an inclined impurity concentration distribution is formed. When the low-temperature epitaxial growth process is employed for the same purpose, an impurity distribution sharper than that formed when the ion implantation process is employed is formed. Practically, in either case, a concentration distribution of a gradient indicated by dotted line in FIG. 3 is formed. Therefore, the depletion layer does not spread greatly when the channel is formed and hence the subthreshold swing cannot be satisfactorily reduced. Even if an ideally sharp stepped impurity distribution is formed, the electric field intensity in the interface of the gate insulating film is only about 10% and the effect of the ideally sharp stepped impurity distribution on the reduction of the electric field intensity in the interface of the gate insulating film is insignificant. Therefore the carrier mobility is not enhanced significantly and hence the current driving ability cannot be satisfactorily improved. Furthermore, although the structure disclosed in Japanese Patent Laid-open (Kokai) No. 60-50960 enhances the carrier mobility, the subthreshold swing increases, standby current increases because the n-type doped layer forming a buried channel is never depleted completely and acts as a channel. Thus, this structure has no effect in reducing the subthreshold swing.

SUMMARY OF THE INVENTION

The present invention has been made to solve the foregoing problems and it is, therefore, an object of the present invention to provide a MIS device suitable for low-voltage operation, having a high current driving ability, and capable of effectively reducing subthreshold swing even when miniaturized, of lowering threshold and of enhancing carrier mobility by reducing the electric field intensity in the interface of the gate insulating film.

Figure 1:
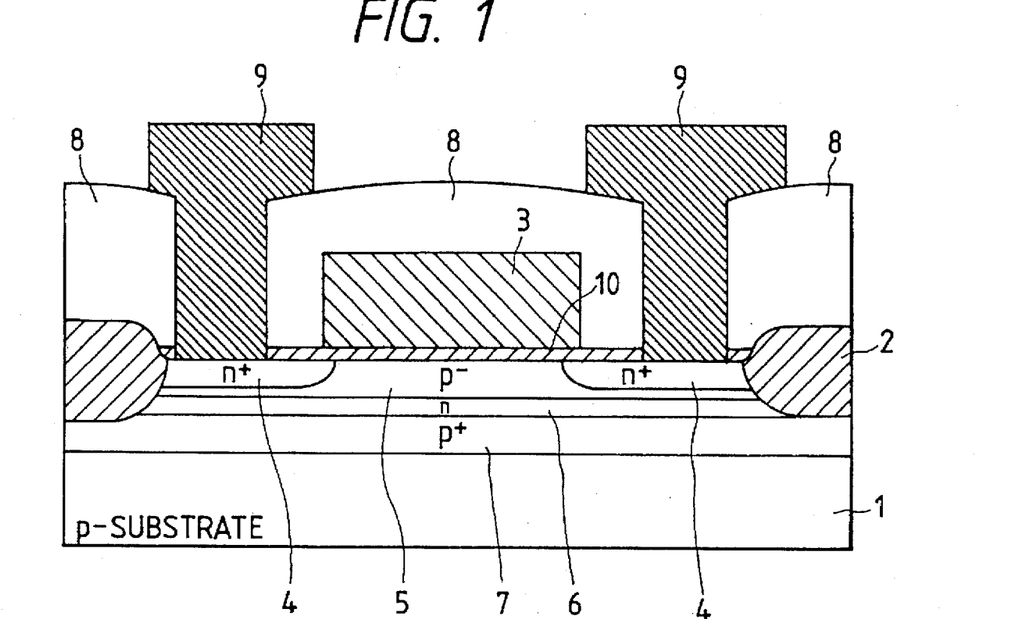
FIG. 1 is a typical sectional view of a MIS device in a first embodiment according to the present invention.

With the foregoing object in view, the present invention provides a MIS device having, as shown in FIG. 1, a pair of first doped layers of a second conductivity type that form source/drain regions, i.e., heavily doped $n^+$-type doped layers 4, formed in the surface of a semiconductor substrate of a first conductivity type, i.e., a p-type substrate i in this case, and a gate electrode 3 formed between the first doped layers of the second conductivity type on a gate insulating film, i.e., a gate insulating oxide film 10, comprising: a second doped layer of the first conductivity type, i.e., a lightly doped p-type doped layer 5 formed on the surface of a channel region between the source/drain regions; a third doped layer of the second conductivity type, i.e., an n-type doped layer 6, underlying the second doped layer of the first conductivity type; and a fourth doped layer of the first conductivity type underlying the third doped layer of the second conductivity type and having an impurity concentration higher than that of the semiconductor substrate, i.e., a heavily doped p$^+$-type buried layer 7; the thickness of the n-type doped layer 6 being determined so that the n-type doped layer 6 can be depleted by the built-in potential of pn junctions formed by the lightly doped p$^-$-type doped layer 5 and the heavily doped p$^+$-type buried layer 7. According to the present invention, the third doped layer of the second conductivity type sandwiched between the lightly doped second doped layer of the first conductivity type and the heavily doped fourth doped layer of the first conductivity type form pn junctions with the overlying layer and the underlying layer, respectively, in the channel region. Since the third doped layer of the second conductivity type forming the pn junctions is depleted by the built-in potential, the depleted layer spreads substantially to the fourth doped layer of the first conductivity type if the depletion layer which spreads when an inversion layer is formed in the channel region, by the application of the gate voltage, reaches the surface of the third doped layer through the depleted third doped layer of the second conductivity type, whereby the capacitance of the depletion layer is reduced. Consequently, subthreshold swing is reduced, the leakage current is diminished and the threshold voltage can be lowered. Since the depletion layer spreads through the second doped layer of the first conductivity type and the third doped layer of the second conductivity type, the longitudinal electric field intensity in the interface of the gate insulating film is reduced and the carrier mobility is enhanced.

In this case, the inversion layer channel formed by the application of the gate voltage is a surface channel formed in the second doped layer of the first conductivity type underlying the gate insulating film.

Figure 5:
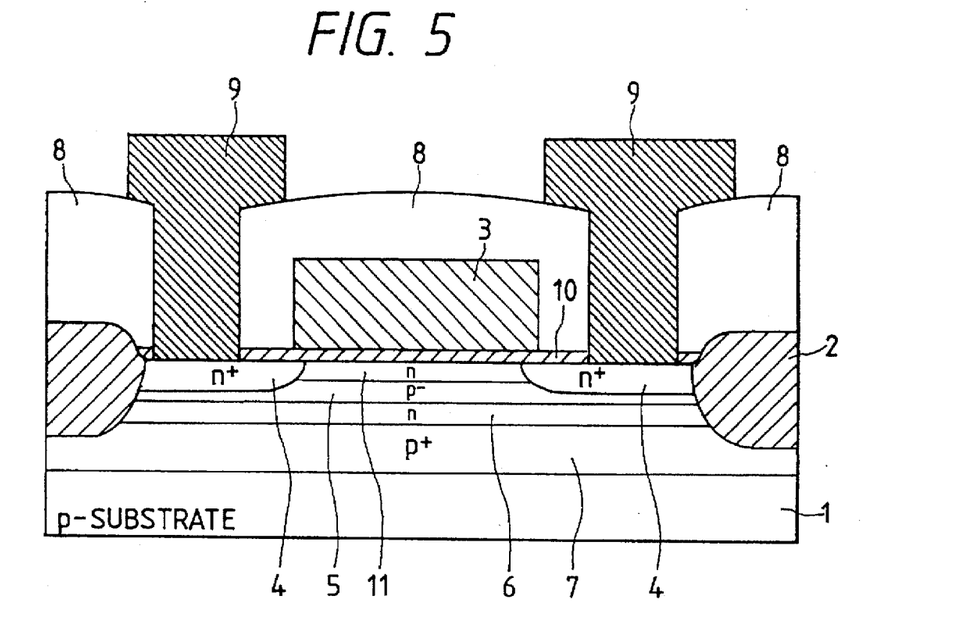
FIG. 5 is a typical sectional view of a MIS device in a second embodiment according to the present invention.

A MIS device in a second aspect of the present invention having as shown in FIG. 5, a semiconductor substrate of a first conductivity type, i.e., a p-type substrate 1, a pair of first doped layers of a second conductivity type that form source/drain regions, i.e., a heavily doped n$^+$-type doped layers 4, and a gate electrode 3 formed on a gate insulating film, i.e., a gate oxide film 10, formed on the semiconductor substrate between the first doped layers of the second conductivity type may comprise: a fifth doped layer of a second conductivity type, i.e., an n-type buried channel layer 11, formed between the source/drain regions on the surface of the channel region; a second doped layer of the first conductivity type, i.e., a lightly doped p$^-$-type doped layer 5, underlying the fifth doped layer of the second conductivity type; a third doped layer of the second conductivity type, i.e., an n-type doped layer 6, underlying the second doped layer of the first conductivity type; and a fourth doped layer of the first conductivity type having an impurity concentration greater than that of the semiconductor substrate underlying the third doped layer of the second conductivity type, i.e., a heavily doped p$^+$-type buried layer 7; the thickness of the n-type doped layer 6 being determined so that the n-type doped layer 6 can be depleted by the built-in potential of pn junctions formed by the lightly doped p$^-$-type doped layer 5 and the heavily doped p$^+$-type buried layer 7, respectively. In this structure, the lightly doped fifth doped layer of the second conductivity type formed between the source/drain regions on the surface of the channel region acts as a very thin buried channel layer. Consequently, the subthreshold swing is reduced, the electric field intensity in the interface of the gate insulating film is reduced, and the MIS device is able to deal with a wide variation of the work function dependent on the material forming the gate electrode. Therefore, the leakage current can reduced, the carrier mobility can be enhanced and a desired threshold voltage can be obtained.

Figure 6A:
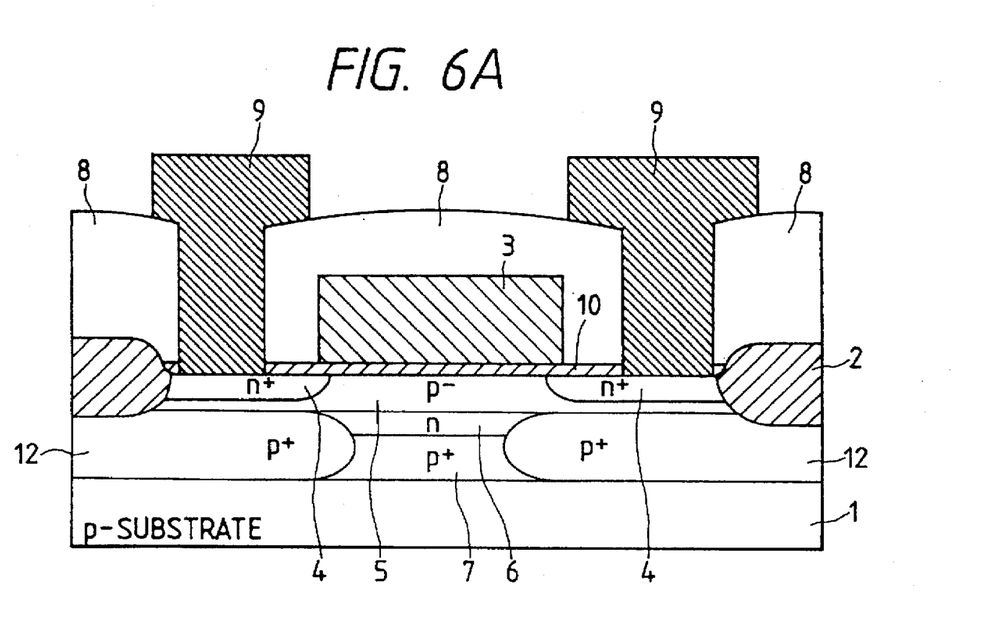
FIGS. 6A and 6B are typical sectional view of a MIS device in third and fourth embodiments according to present invention.

It is preferable to form sixth doped layers of the first conductivity type having an impurity concentration greater than that of the semiconductor substrate, i.e., p$^+$-type pocket regions 12, at a predetermined distance from at least one of the opposite ends of the channel region of the third doped layer of the second conductivity type as shown in FIG. 6A. The pocket regions 12 suppress punch-through through the third doped layer of the second conductivity type between the source/drain regions.

Figure 9:
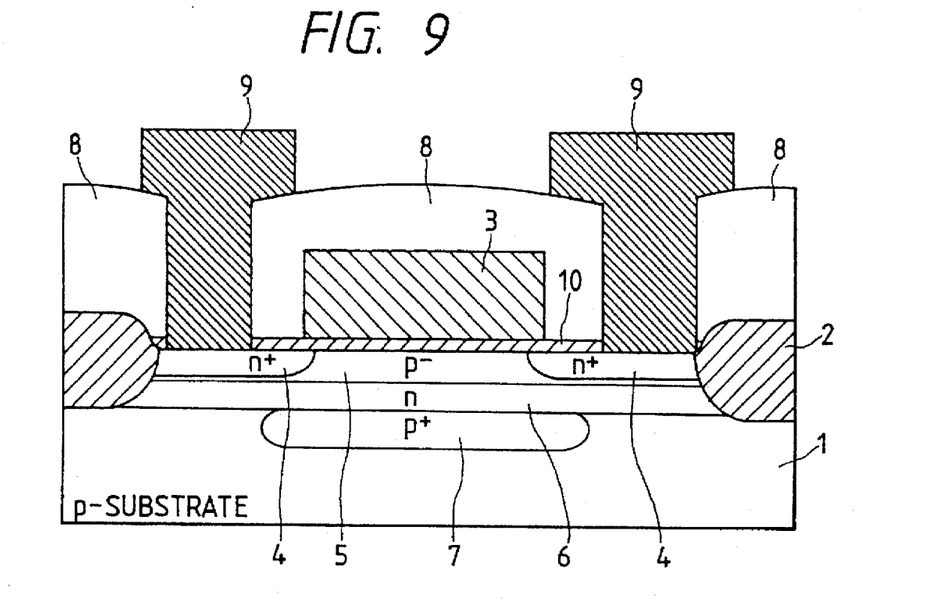
FIG. 9 is a typical sectional view of a MIS device in a sixth embodiment according to the present invention.

The fourth doped layer of the first conductivity type may be formed under the channel region as shown in FIG. 9 instead of under the source/drain regions.

A lightly doped layer of the second conductivity type having an impurity concentration smaller than that of the first doped layer of the second conductivity type may be added to the first doped layer of the second conductivity type forming the drain region. The lightly doped layer of the second conductivity type moderates the electric field in the drain region and hence the breakdown voltage increases.

Figure 6B:
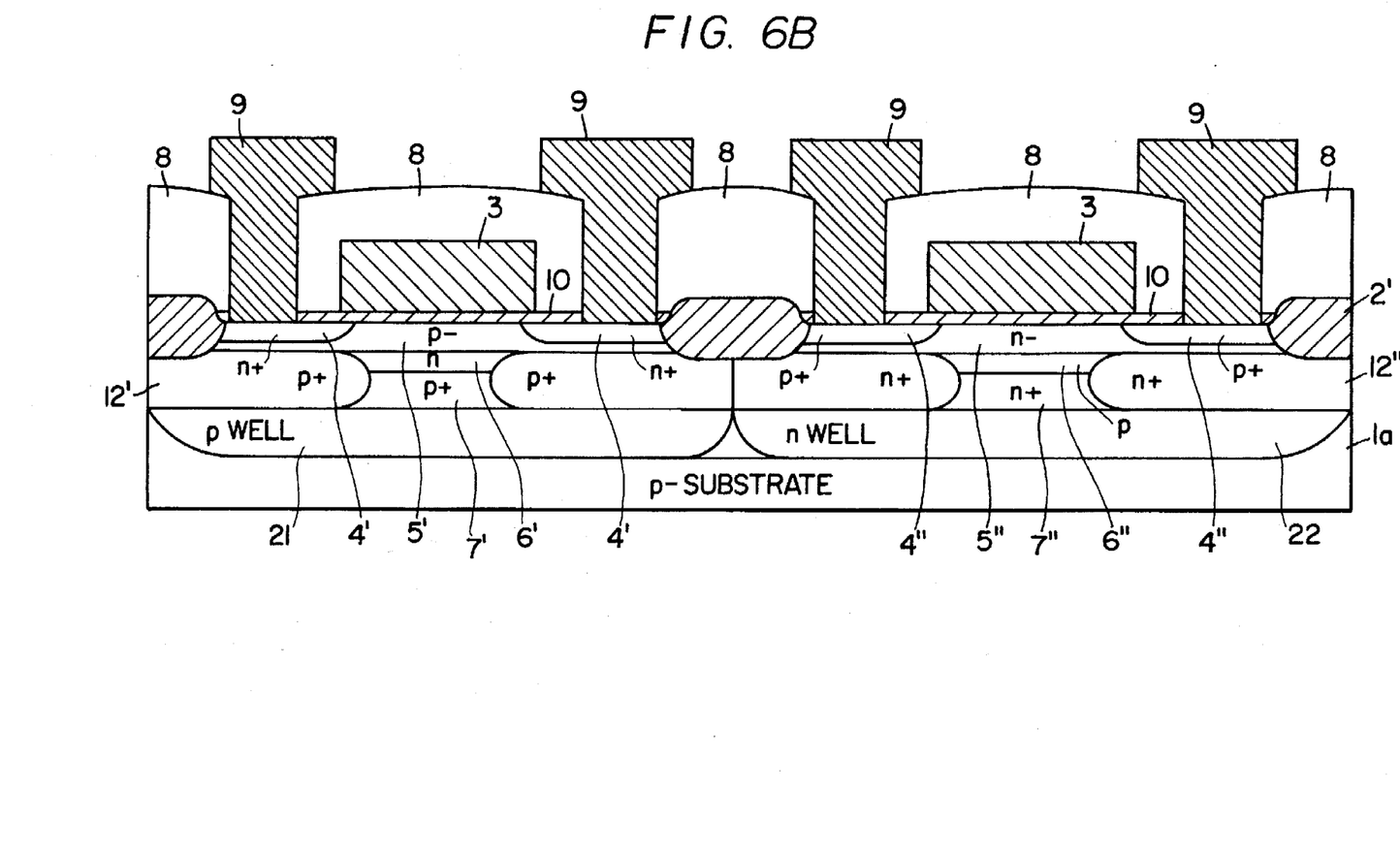
Figure 7A:
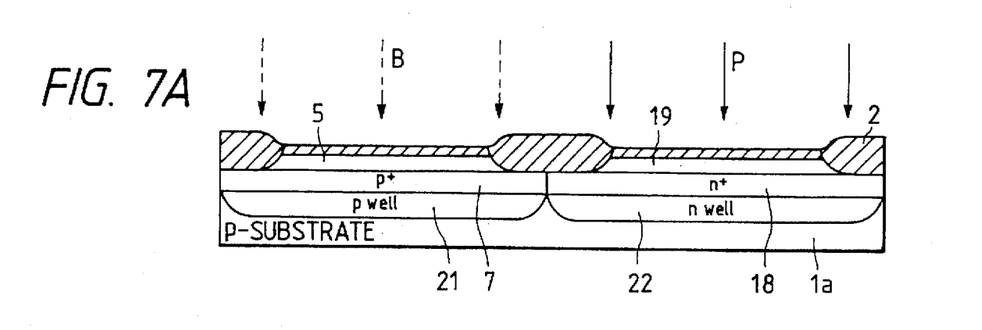
FIGS. 7A to 7C are typical sectional views of a workpiece in sequential steps of method of fabricating a MIS device in a fifth embodiment according to the present invention.
Figure 7B:
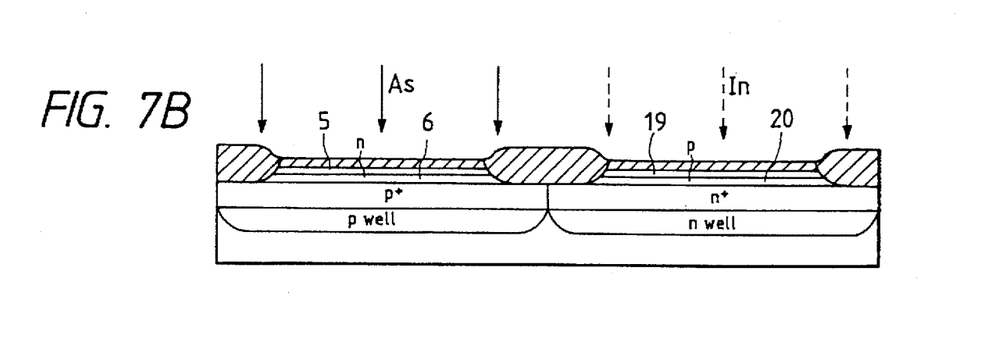
Figure 7C:
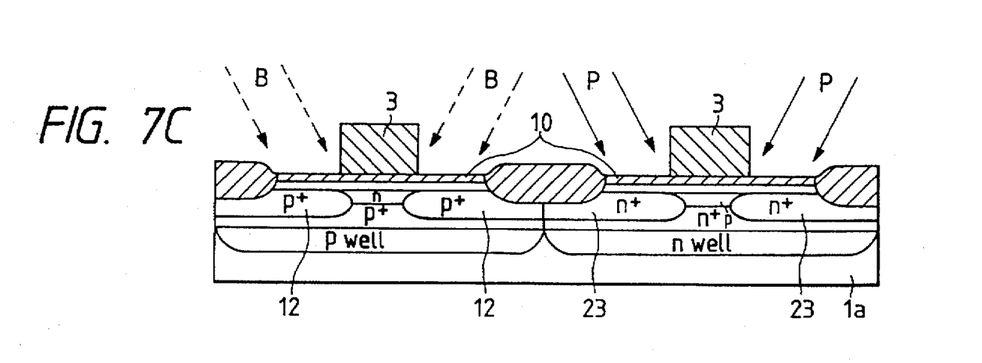
Figure 8A:
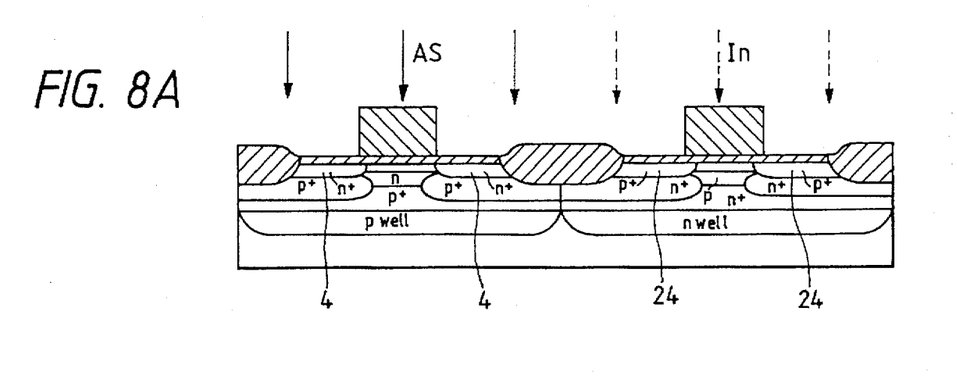
FIG. 8A and FIG. 8B are typical sectional views of the workpiece in sequential steps following the step shown in FIG. 7C.
Figure 8B:
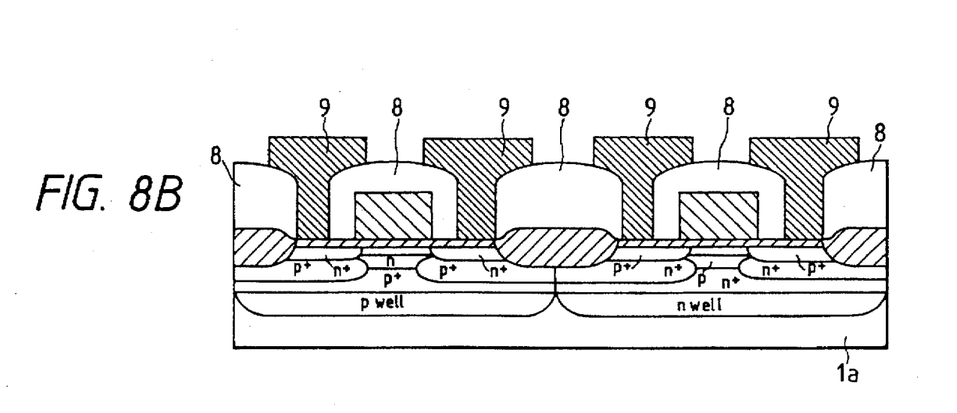

In either of the aforesaid MIS devices, for example, in the MIS device shown in FIG. 6A, a complementary MIS integrated circuit such as in FIG. 6B, using the following fabrication scheme as shown in FIGS. 7 and 8, can be formed by using a well region of the first conductivity type, i.e., a p-type well 21, formed in a semiconductor substrate, i.e., a p-type substrate 1a as the semiconductor substrate 1 of the first conductivity type, forming the other doped layers, as shown in FIG. 6, thereon and forming doped layers of conductivity types opposite the conductivity types of the doped layers formed on the p-type well 21, i.e., p-type doped layers instead of the n-type doped layers and n-type doped layers instead of the p-type doped layers, on a well region of the second conductivity type, i.e., an n-type well 22. A complementary MIS integrated circuit thus formed has a low leakage current and a high current driving ability, suitable for low-voltage operation and is capable of operating a low power consumption, because the subthreshold swing is reduced and the electric field intensity in the interface of the gate insulating film is reduced.

Figure 11:
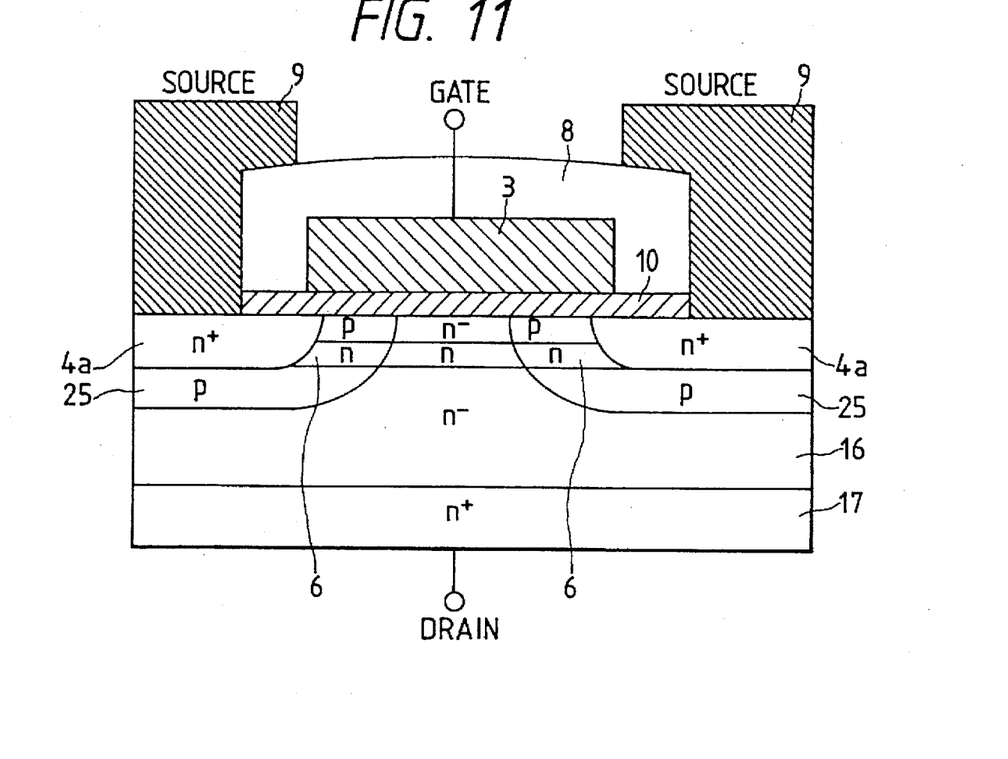
FIG. 11 is a typical sectional view of a MIS device in and eighth embodiment according to the present invention.

The present invention further provides a MIS device in a third aspect of the present invention comprising, as shown in FIG. 11, a drain region comprising a semiconductor substrate of the second conductivity type and an epitaxial layer of the second conductivity type, i.e., a drain region consisting of an n$^+$-type base substrate 17 and an n$^-$-type epitaxial layer 16, formed on the semiconductor substrate of the second conductivity type; a first doped layer of the second conductivity type forming a source region and formed so as to be in self-alignment with a gate electrode 3 formed on a gate insulating film 10 formed on the epitaxial layer; and a second doped layer of the first conductivity type forming a channel region, i.e., an n$^+$-type source region 4a and a p-channel region 25; characterized by a third doped layer of the second conductivity type, i.e., an n-type doped layer 6, formed in a predetermined depth from the surface of the channel region in a thickness such that the third doped layer of the second conductivity type is depleted by the built-in potential of a pn junction formed by the second doped layer of the first conductivity type. Since the third doped layer of the second conductivity type of this vertical power MOS transistor makes the depletion layer in the channel region which spreads in forming an inversion layer by the application of a gate voltage spread, the capacitance of the depletion layer is reduced and the subthreshold swing is reduced, whereby the leakage current can be reduced and the threshold voltage can be lowered.

BRIEF DESCRIPTION OF THE DRAWINGS

The above and other objects, features and advantages of the present invention will become more apparent from the following description taken in connection wit the accompanying drawings, in which.

DESCRIPTION OF THE PREFERRED EMBODIMENTS

Preferred embodiments of the present invention will be described hereinafter with reference to the accompanying drawings.

EXAMPLE 1

FIG. 1 is a typical sectional view of a MIS device in a first embodiment according to the present invention, in which parts like or corresponding to those shown in FIG. 2 are designated by the same reference characters and the description thereof will be omitted. As shown in FIG. 1, the MIS device in the first embodiment differs from the conventional MIS device shown in FIG. 2 in that an n-type doped layer 6 of the same conductivity type as that of an $n^+$-type source/drain regions 4 is formed between a lightly doped $p^-$-type doped layer 5 and a heavily doped $p^+$-type buried layer 7 on the surface of a channel region. In FIG. 3, both the continuous line and dotted line indicate the impurity concentration distribution in the channel region thus formed and the conventional channel region, respectively, as a function of the depth from the surface of the substrate. In the case of the impurity concentration distributions shown in FIG. 3, the peak impurity concentration of the n-type doped layer 6 is on the order of $2\times10^{17}$ cm$^{-3}$ and the width of the n-type doped layer 6 sandwiched between the p-type layers 5 and 7 is about 50 nm. In the structure having such a impurity concentration distribution, each of pn junctions formed between the lightly doped $p^-$-type doped layer 5 and the n-type doped layer 6 and between the heavily doped $p^+$-type buried layer 7 and the n-type doped layer 6 has a built-in potential, the n-type doped layer 6 is depleted even when any voltage is not applied to the gate electrode 3. Naturally, the n-type doped layer 6 is formed in a thickness so that the n-type doped layer 6 is depleted. The thickness is dependent on the respective impurities of the n-type doped layer 6 and the $p^-$-type doped layer 5. When the impurity concentration of the $p^-$-type doped layer 5 is in the range of $10^{16}$ to $10^{17}$ cm$^{-3}$, a desirable impurity concentration of the n-type doped layer 6 is in the range of $10^{16}$ to $10^{18}$ cm$^{-3}$, more preferably, in the range of $10^{16}$ to $2\times10^{17}$ cm$^{-3}$. For example, when the impurity concentration of the heavily doped $p^+$-type buried layer 7 is $5\times10^{18}$ cm$^{-3}$ and that of the $p^-$-type doped layer 5 is $10^{16}$ cm$^{-3}$, the n-type doped layer can be depleted when the impurity concentration of the n-type doped layer 6 is in the range of $10^{16}$ cm$^{-3}$ (the thickness of the n-type doped layer 6 is 0.2 μm) to $10^{18}$ cm$^{-3}$ (the thickness of the n-type doped layer 6 is 0.02 μm). It is preferable that the n-type doped layer 6 is depleted by pinch-off by the spread of depletion layers from the p-type doped layer 5 overlying the n-type doped layer 6, and the heavily doped $p^+$-type buried layer 7 underlying the n-type doped layer 6. Therefore, even when the n-type doped layer 6 is formed, the n$^+$ source/drain regions 4 are not connected electrically. Thus, this embodiment is entirely different from the prior art buried channel MOSFET illustrated in FIG. 3 of Japanese Patent Laid-open (Kokai) No. 60-50960, in which the n-type doped layer sandwiched between the p-type doped layers is not depleted and is used as a channel. In the present embodiment, however, the doped layers are constructed so as to deplete the n-type doped layer 6 sandwiched between the p-type doped layers completely in use. This embodiment is different from the prior art buried channel MOSFET in using the p-type buried layer 7 as a punch-through stopper for stopping punch-through through the source and the drain. If a nondoped layer is formed between the p-type layers 5 and 7 instead of the n-type doped layer 6, the nondoped layer sandwiched between the p-type layers 5 and 7 is depleted. However, since the nondoped layer has no action to cancel the impurity concentrations of the p-type doped layer 5 overlying the nondoped layer and the p-type doped layer underlying the same, the effect on moderating the electric field intensity is insignificant, the subthreshold swing cannot be reduced and the carrier mobility cannot be enhanced.

Figure 4:
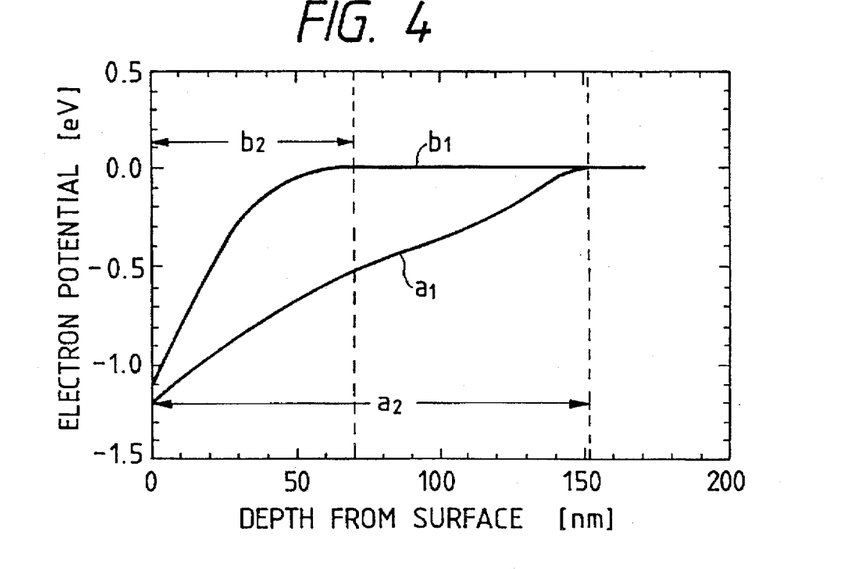
FIG. 4 is a graph showing the variation of the potential of electrons within a channel in forming an inversion layer for a MIS device in accordance with the present invention and a conventional MIS device.

When the surface potential is decreased by applying a voltage to the gate electrode 3 and a depletion layer spreading from an inversion layer formed on the surface of the channel region reaches the upper surface of a depletion layer in the pn junction formed by the lightly doped $p^-$-type doped layer 5 and the n-type doped layer 6, the n-type doped layer is depleted. Therefore, it is possible to make the depletion layer substantially spreading from the inversion layer spread to the upper surface of the heavily doped p$^+$-type buried layer 7, whereby the capacitance of the depletion layer can be reduced, the subthreshold swing can be reduced, a low threshold voltage on the order of 0.2±0.1 V can be used, the electric field intensity in the interface between the gate insulating oxide film 10 and the channel region can be reduced to enhance the carrier mobility. Consequently, the current driving ability is enhanced. In FIG. 4 showing the variation of the potential of electrons in the channel region with the depth from the surface of the substrate in forming the inversion layer, a characteristic curve a$_1$ is for the MIS device of the present invention shown in FIG. 1, a$_2$ indicates the width of the depletion layer in the MIS device of the present invention, a characteristic curve b$_1$ is for the prior art MIS device shown in FIG. 2 and b$_2$ indicates the width of the depletion layer in the prior art MIS device. The impurity concentration distributions are shown in FIG. 3. As indicated by the characteristic curve b$_1$ in FIG. 4, the potential in the prior art MIS device increases sharply with the depth in the substrate, and the width b$_2$ of the depletion layer in forming the inversion layer is about 70 nm. As indicated by the characteristic curve a$_2$, the potential in the MIS device of the present invention increases gradually from the surface of the substrate through the p$^-$-type doped layer 5 and the n-type doped layer 6, and the width a$_2$ of the depletion layer is 150 nm, which is about twice as large as the width b$_2$.

Since the electric field intensity in the interface of the gate insulating film is the gradient of the surface potential, it is known from the characteristic curve b$_1$ of FIG. 4 that the electric field intensity in the prior art MIS device is about 0.2 MV/cm. As indicated by the characteristic curve a$_1$ of FIG. 4, the potential within the lightly doped p$^-$-type doped layer 5 on the surface of the channel region of the MIS device of the present invention varies gently (i.e., gradually) and the electric field intensity in the interface of the gate insulating film is as low as about 0.1 MV/cm. Therefore, the carrier mobility in the surface channel region is enhanced.

The MIS device in accordance with the present invention shown in FIG. 1 and having such distinctive features, similarly to the prior art MIS device shown in FIG. 2, is fabricated by the following processes by using, a p-type silicon substrate 1 having an impurity concentration of, for example, 1×10$^{16}$ cm$^{-3}$. First, an isolation insulator region 2 of an oxide film having a thickness on the order of 0.4 µm is formed by a LOCOS oxidation method, and then the surface of the p-type silicon substrate 1 is doped with boron in an impurity dose of 1×10$^{13}$ cm$^{-2}$ by ion implantation using ion energy of 80 keV to form the heavily doped p$^+$-type buried layer 7, i.e., the so-called punch-through stopper, of a depth on the order of 0.4 µm having a peak concentration depth of about 0.3 µm from the surface. In this ion implanting process, the lightly doped p$^-$-type doped layer 5 of an impurity concentration on the order of 5×10$^{16}$ cm$^{-3}$ is formed by the spread of ion implantation.

Then, arsenic is implanted in an impurity dose of 2.5×10$^{12}$ cm$^{-2}$ by ion implantation using ion energy of 180 keV to form the n-type doped layer 6 having a width on the order of 50 nm and a peak concentration depth of about 0.12 µm from the surface of the substrate. Then, after removing a protective oxide film for protecting a device region during the ion implantation processes by etching, the gate insulating oxide film 10 of, for example, 5 nm in thickness is formed by the thermal oxidation of the surface. Then, known MOS transistor fabricating processes are carried out sequentially to complete the MIS device of FIG. 1 by forming, for example, the n$^+$-type gate electrode 3 of polycrystalline silicon, the n$^+$-type source/drain regions 4 by implanting arsenic in an impurity dose of 2×10$^{15}$ cm$^{-2}$ by ion implantation using ion energy of 25 keV, the interlayer insulating film 8, via holes and the metal wiring lines 9.

Figure 12:
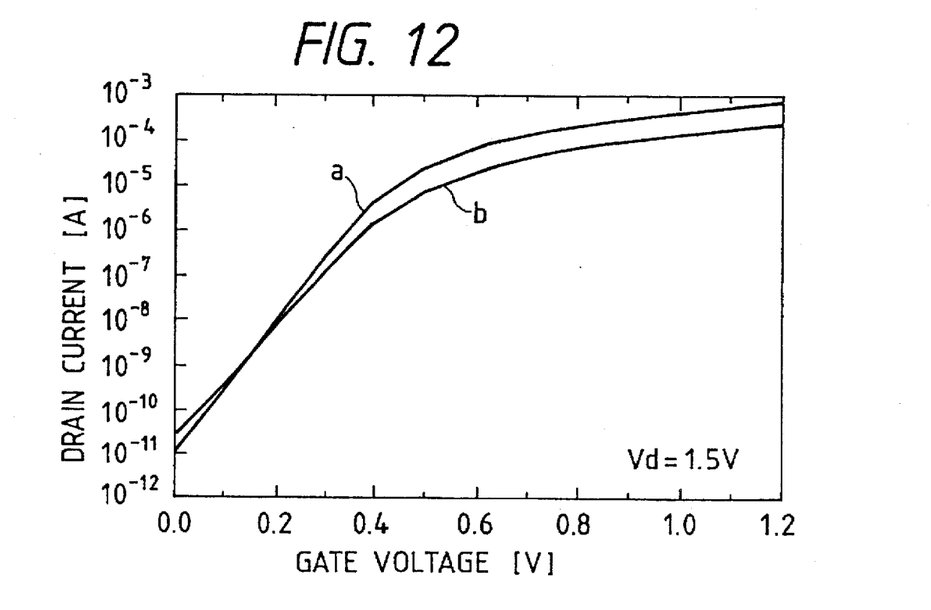
FIG. 12 is a graph showing the relation between the drain current and the gate voltage for a MIS device in accordance with the present invention and a conventional MIS device.

FIG. 12 shows the dependence of the drain current on the gate voltage in the NMOS transistor in accordance with the present invention thus fabricated determined by simulation, in which the drain voltage V$_d$ was 1.5 V, in comparison with the characteristics of the prior art structure shown in FIG. 2. In FIG. 12, a curve a is for the NMOS transistor in this embodiment and a curve b is for the prior art NMOS transistor. It is known from FIG. 12 that the leakage current in the transistor in this embodiment is 1/7 of that in the prior art transistor when the gate voltage is 0 V, and the threshold voltages Vth (a gate voltage when the drain current is 10 nA) for the transistor in this embodiment and the prior art transistor are 0.2 V. Since the subthreshold swing is small, the reduction ratio of the drain current for a gate voltage below the threshold voltage Vth, i.e., the subthreshold current, is large and the leakage current is reduced. The intensity of the drain current for the same gate voltage is high, the drain saturation current is 2.5 times as large as that of the prior art structure, and the current driving ability is higher than that of the prior art structure.

Figure 13:
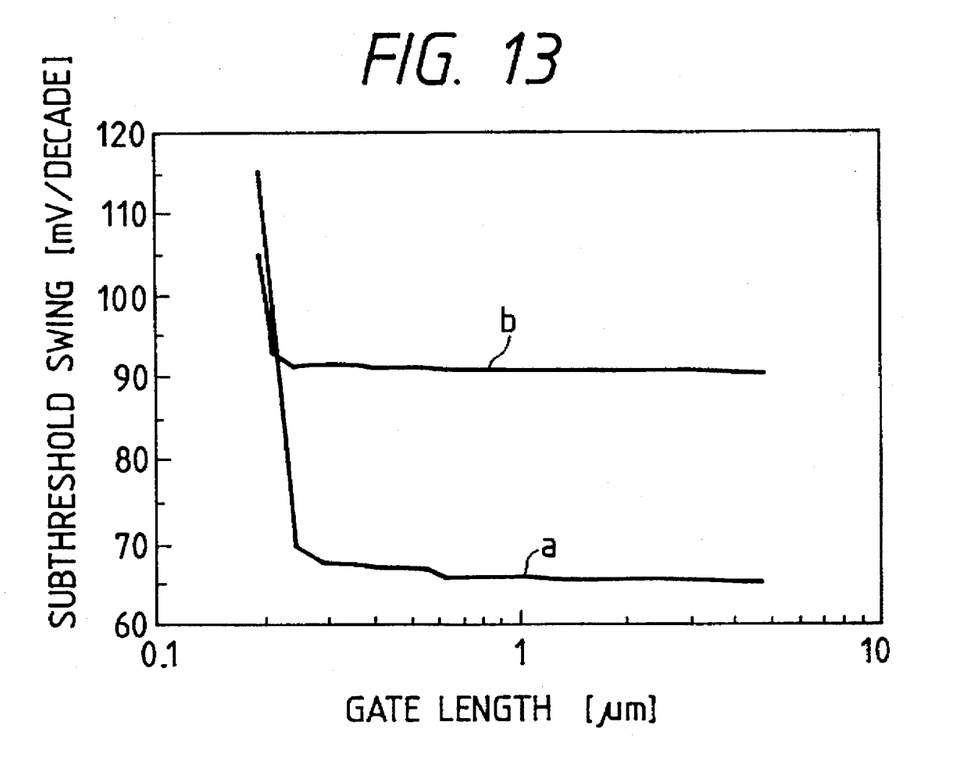
FIG. 13 is a graph showing the dependence of the subthreshold swing on the gate length for a MIS device in accordance with the present invention and the conventional MIS device.

Results of simulation of the dependence of subthreshold swing on gate length in the NMOS transistor in this embodiment and the prior art NMOS transistor are shown comparatively in FIG. 13, in which the drain voltage V$_d$ is 1.5 V. In FIG. 13, a characteristic curve a is for the NMOS transistor in this embodiment and a characteristic curve b is for the prior art NMOS transistor. While the subthreshold swing of the prior art transistor is as large as about 90 mV/decade, the subthreshold swing of the transistor in this embodiment is as small as about 70 mV/decade and the subthreshold swing of the NMOS transistor in this embodiment remains substantially constant to a gate length of 0.25 µm. Punch-through occurs in the NMOS transistor in this embodiment at a gate length approximately equal to that at which punch-through occurs in the prior art NMOS transistor.

In this embodiment, the impurity concentration distribution in the channel region is formed by an ion implanting process, the formation of the lightly doped p$^-$-type doped layer 5 and the n-type doped layer 6 can be further accurately controlled when a low-temperature epitaxial growth process using a temperature in the range of about 500° to about 600° C. or an MBE (molecular beam epitaxy) process is employed. A device having a further high current driving ability can be obtained when the lightly doped p-type doped layer 5 is formed of a material having a high carrier mobility, such as silicon germanium.

Although this embodiment is an application of the present invention to a silicon MOS transistor, naturally, the present invention is applicable to MIS devices using other semiconductors. Although the NMOS transistor has been mainly described in this embodiment, a PMOS transistor can be fabricated by using impurities of conductivity types opposite to those of the impurities used for fabricating the NMOS transistor in this embodiment. The values specifically shown herein in explaining the ion implanting processes and such are only examples and may be changed according to design conditions when necessary.

EXAMPLE 2

A MIS device in a second embodiment according to the present invention will be described hereinafter with reference to FIG. 5 showing the structure of the MIS device in the second embodiment in a typical sectional view, in which parts like or corresponding to those of the first embodiment shown in FIG. 1 are designated by the same reference characters and the description thereof will be omitted. Referring to FIG. 5, the MIS device in the second embodiment is a buried channel MOS transistor. This buried channel MOS transistor differs in structure from the NMOS transistor shown in FIG. 1 in that an n-type buried layer 11 of the same conductivity type as that of an $n^+$-type source/drain regions 4 is formed on the surface of the channel region. The MIS device provided with the n-type buried channel layer 11 is capable of dealing with variation of work function dependent on the material forming the gate electrode and is able to obtain a desired threshold voltage, and surface scattering is reduced and carrier mobility is enhanced because the path of the channel current is apart form the interface of the gate insulating film.

The structure in this embodiment is formed by the following method. After forming the lightly doped $p^-$-type doped layer 5 and the layers under the lightly doped $p^-$-type doped layer 5 by boron ion implantation process by the same processes as those employed in forming the corresponding layers of the first embodiment, the surface of the substrate is doped with phosphorus by an ion implantation process using ion energy of 20 keV to form an n-type buried layer 11 having an impurity concentration on the order of $1 \times 10^{17}$ $cm^{-3}$ and a depth on the order of 50 nm. Then, the same processes as that employed in forming the first embodiment are carried out to complete the structure shown in FIG. 5.

The buried channel MOS transistor in the second embodiment, similarly to the surface channel MOS transistor in the first embodiment, has a subthreshold swing smaller than that of the prior art structure shown in FIG. 2, and the leakage current is reduced as shown in FIG. 12.

EXAMPLE 3

A MIS device in a third embodiment according to the present invention will be described with reference to FIG. 6A showing the structure of the MIS device in a sectional view, in which parts like or corresponding to those of the first embodiment shown in FIG. 1 are designated by the same reference characters and the description thereof will be omitted. The MIS device in the third embodiment differs in structure from the structure shown in FIG. 1 in that $p^+$-type pocket regions 12, i.e., highly doped p-type doped layers, are formed on the opposite ends of a channel region. The $p^+$-type pocket regions 12 are formed so as to cover the channel ends of the n-type doped layer 6 and the heavily doped $p^+$-type buried layer 7 leaving the surface of the lightly doped $p^-$-type doped layer 5. Each $p^+$-type pocket region 12 is formed at a predetermined distance toward the channel region from the end of the $n^+$-type source/drain region 4. In this embodiment, each $p^+$-type pocket region 12 was formed by an oblique ion implantation process so that the end of each $p^+$-type pocket region 12 is at a distance of 0.1 μm toward the channel region from the end of the $n^+$-type source/drain region 4. The $p^+$-type pocket regions 12 thus formed suppress punch-through between the $n^+$-type source/drain regions 4 through the low-potential n-type doped layer 6, suppress the influence of the drain voltage on the channel region and suppress the reduction of the threshold voltage in the short-channel structure, i.e., the so-called short-channel effect. The carrier mobility is on a level equal to that of the carrier mobility in the first embodiment even if the MIS device is provided with the $p^+$-type pocket regions 12, because the lightly doped $p^-$-type doped layer 5 in which an inversion layer is formed when the gate voltage is applied maintains the impurity concentration in the entire surface of the channel forming region on a low level.

The structure in this embodiment is fabricated by the following method. After forming the gate electrode 3 and the layers under the gate electrodes 3 by the same processes as those employed in forming the corresponding layers of the first embodiment, the $p^+$-type pocket regions 12 of an impurity dose of $6 \times 10^{12}$ $cm^{-2}$ are formed by an oblique boron ion implantation process using ion energy of 60 keV and the gate electrode 3 as a mask. Then, the $n^+$-type source/drain regions 4 of an impurity dose of $2 \times 10^{15}$ $cm^{-2}$ are formed by arsenic ion implantation process using ion energy of 25 keV. The rest of the components are formed by the steps of the same MOS transistor fabricating method as that used in fabricating the first embodiment to complete the structure shown in FIG. 6A. The punch-through suppressing performance of the pocket region 12 is effective even if the pocket region 12 is formed on one end of the channel region through which punch-through occurs, i.e., on the drain side or the source side of the channel region.

The third embodiment, similarly to the first embodiment, reduces the subthreshold swing, reduces impurity scattering in the channel region and lowers the longitudinal electric field intensity in the interface of the gate insulating film, so that the threshold voltage can be reduced and the current driving ability can be enhanced.

EXAMPLE 4

A MIS device of a CMOS structure consisting of an n-channel MOS transistor, such as shown in FIG. 6A, and a complementary, p-channel MOS transistor is shown in FIG. 6B. As noted earlier in this specification, the fabrication scheme according to the fifth embodiment (to be described hereinbelow with regard to FIGS. 7-8) is similarly applicable in the manufacture of a MIS device having a CMOS structure such as that shown in FIG. 6B.

EXAMPLE 5

A MIS device of a CMOS structure in a fifth embodiment according to the present invention will be described with reference to FIGS. 7A, 7B, 7C, 8A and 8B showing a workpiece in different steps of a method of fabricating the MIS device in sectional views, in which parts like or corresponding to those of the first embodiment shown in. FIG. 1 are designated by the same reference characters. In this embodiment, the gate electrode is formed of titanium nitride having a work function intermediate between those of $n^+$-type polycrystalline silicon and $p^+$-type polycrystalline silicon to form both the NMOS and the PMOS transistor of the MIS device in this embodiment in a surface-channel structure provided with the same pocket regions as those of the third and fourth embodiments shown in FIG. 6A and 6B.

Referring to FIG. 7A, a p-type well region 21 is formed in an area for the NMOS transistor in the surface of a p-type silicon substrate 1a having an impurity concentration on the order of $10^{15}$ $cm^{-3}$ and an n-type well region 22 is formed in an area for the PMOS transistor in the surface of the p-type silicon substrate 1a by known CMOS device fabricating processes. Both the well regions 21 and 22 are formed in a depth on the order of 0.6 μm and an impurity concentration on the order of $1 \times 10^{16}$ $cm^{-3}$. The impurity concentrations of those well regions correspond to the impurity concentration of the substrate of the third embodiment. An isolation insulator region 2, i.e., an oxide film of a thickness on the order of 0.4 μm, is formed by a LOCOS oxidation method. Then, a highly doped $p^+$-type buried layer 7, which serves as a punch-through stopper, having a depth on the order of 0.4 µm, an impurity dose of 1×10¹³ cm⁻² and a peak impurity concentration near a plane at a depth of 0.3 µm from the surface of the p-type well region 21 is formed by a boron ion implantation process using ion energy of 80 keV and, simultaneously, a lightly doped p-type doped layer 5 having an impurity concentration on the order of 5×10¹⁶ cm⁻³ is formed in the surface of the substrate by the diffusion of ions. Subsequently, a heavily doped n⁺-type buried layer 18, which serves as a punch-through stopper, having a depth on the order of 0.4 µm, a peak impurity concentration near a plane at a depth of 0.3 µm from the surface of the n-type well region 22 is formed by a phosphorus ion implantation using ion energy of 200 keV and, simultaneously, a lightly doped n⁻-type doped layer 19 of an impurity concentration on the order of 5×10¹⁶ cm⁻³ is formed in the surface of the substrate by the diffusion of ions. In the ion implantation processes, ions are implanted through a thin oxide film to prevent damaging the surface of the substrate with ions.

Then, as shown in FIG. 7B, an n-type layer 6 having an impurity dose of 2.5×10¹² cm⁻² is formed in the region for the NMOS transistor by an arsenic ion implantation using ion energy of 180 keV, and a p-type layer 20 having an impurity dose of 2.5×10¹² cm⁻² is formed in the region for the PMOS transistor by indium ion implantation using ion energy of 180 keV.

Then, as shown in FIG. 7C, a gate insulating oxide film 10 of a thickness of 5 nm is formed by oxidation, a titanium nitride film is deposited by a CVD process, and then the titanium nitride film is etched by a photolithographic dry etching process to form gate electrodes 3. Then, a p⁺-type pocket region 12 having an impurity dose of 6×10¹² cm⁻² is formed in the region for the NMOS transistor by oblique boron implantation using ion energy of 60 keV and a photomask, and an n⁺-type pocket region 23 having an impurity dose of 6×10¹² cm⁻² is formed in the region for the PMOS transistor.

Then, as shown in FIG. 8A, n⁺-type source/drain regions 4 having an impurity dose of 2×10¹⁵ cm⁻² is formed in the region for the NMOS transistor by implanting arsenic through the gate oxide film 10 by ion implantation using ion energy of 25 keV, and p⁺-type source/drain regions 24 having an impurity dose of 2×10¹⁵ cm⁻² is formed in the region for the PMOS transistor by implanting indium through the gate oxide film 10 by ion implantation using ion energy of 25 keV.

Then, as shown in FIG. 8B, an interlayer insulating film 8, i.e., an oxide film, is deposited by a CVD process, via holes are formed in the layer insulating film 8 by a photolithographic etching process, a wiring metal film, such as an aluminum film is formed by evaporation, and then metal wiring lines 9 are formed by patterning the wiring metal film by a photolithographic etching process to complete the CMOS device.

The p⁺-type pocket regions 12 and the n⁺-type pocket regions 23 of the PMOS transistor and the NMOS transistor suppress punch-through through the n-type doped layer 6 between the n⁺-type source/drain regions 4 and punch-through through the p-type doped layer 20 between the p⁺-type source/drain regions 24, respectively, and suppress the influence of the drain voltage on the channel region to suppress the reduction of the threshold voltage in the short-channel structure, i.e., the so-called short-channel effect. Although the CMOS device is provided with the p⁺-type pocket regions 12 and the n⁺-type pocket regions 23, the carrier mobility is equal to that in the first embodiment, because the lightly doped p⁻-type doped layer 5 and the lightly doped n⁻-type doped layer 19, in which inversion layers are formed when the gate voltage is applied, maintain the entire surface of the channel region in a low impurity concentration. Since the n-type layer 6 and the p-type layer 20, similarly to the corresponding layers of the first embodiment, are formed in a thickness so that the n-type layer 6 and the p-type layer 20 are depleted by the built-in potentials of the pn junctions, respectively, it is possible to make the depletion layers which spreads from the inversion layers in forming the channel spread to the upper surfaces of the heavily doped p⁺-type buried layer 7 and the heavily doped n⁺-type buried layer 18. Since the capacitance of the depletion layers are thus reduced, the subthreshold swing can be reduced, so that the respective threshold voltages of the NMOS transistor and the PMOS transistor are on the order of 0.2 V and −0.2 V, respectively, and the electric field intensity in the interface of the gate oxide film 10 can be reduced to enhance the carrier mobility. Therefore, the CMOS is able to operate at a high operating speed on a low supply voltage. Naturally, this CMOS device operates at a low power consumption, which is the feature of CMOS devices.

The CMOS device in this embodiment may comprise a surface-channel NMOS transistor having a gate electrode formed of n⁺-type polycrystalline silicon, and a buried channel PMOS transistor as that of the second embodiment.

Although the CMOS device in this embodiment is provided with the p-type well region and the n-type well region, the p-type well region 21 may be omitted when a p-type substrate 1 having an impurity concentration on the order of 1×10¹⁶ cm⁻³ is employed.

The values specifying ion implantation conditions herein are only examples and are not limitative and, naturally, the design may be changed when necessary.

EXAMPLE 6

A MIS device in a sixth embodiment according to the present invention will be described with reference to FIG. 9 showing the structure of the MIS device in a sectional view, in which parts like or corresponding to those of the MIS device in the first embodiment shown in FIG. 1 are designated by the same reference characters and the description thereof will be omitted. In this embodiment, a heavily doped p⁺-type buried layer 7 is formed only under a channel region and is not extended under n⁺-type source/drain regions 4, which is different from the structure shown in FIG. 1. Since the heavily doped p⁺-type buried layer 7 is formed only under the channel region, increase in source/drain junction capacitance can be suppressed.

When forming the heavily doped p⁺-type buried layer 7 of this structure by boron ion implantation by the fabricating processes employed in fabricating the first embodiment, a photomask may be used to form the heavily doped p⁺-type buried layer 7 only under the channel region or the heavily doped p⁺-type buried layer 7 may be formed by forming a heavily doped p⁺-type buried layer in the entire surface of the substrate and by cancelling portions of the heavily doped p⁺-type buried layer other than a portion for the heavily doped p⁺-type buried layer 7 by implanting phosphorus of the opposite conduction type by ion implantation in the portions other than the portion for the heavily doped p⁺-type buried layer 7.

In this embodiment, since the impurity concentration of regions underlying the n⁺-type source/drain regions 4 is equal to the impurity concentration of the p-type substrate 1 and the impurity concentration of the p-type substrate 1 is about 1/10 of the impurity concentration of the corresponding regions of the structure shown in FIG. 1, the source/drain junction capacitance can be reduced to 1/3. Consequently, the delay due to the charging and discharging of the parasitic capacitance of the source/drain is reduced and hence the operating speed of the MIS device in the sixth embodiment is higher than that of the MIS device in the first embodiment.

EXAMPLE 7

Figure 10:
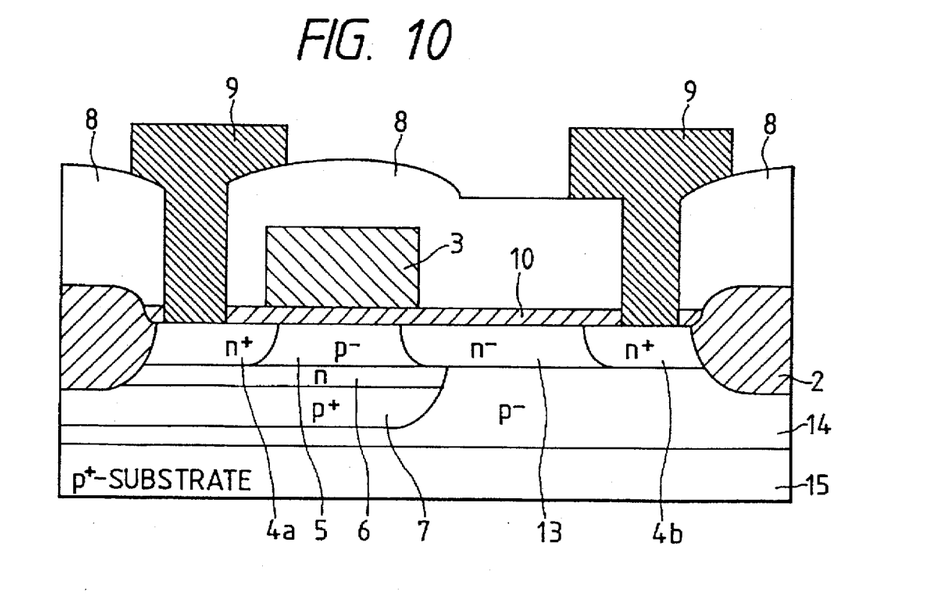
FIG. 10 is a typical sectional view of a MIS device in a seventh embodiment according to the present invention.

A MIS device in a seventh embodiment according to the present invention will be described with reference to FIG. 10, in which parts like or corresponding to those of the first embodiment shown in FIG. 1 are designated by the same reference characters and the description thereof will be omitted. This MIS device shown in FIG. 10 is a lateral power MOS transistor. The structure of this embodiment differs from that of the first embodiment in that a substrate formed by forming a $p^-$-type epitaxial layer 14 by an epitaxial growth process on a $p^+$-type base substrate 15 is used, a lightly doped $n^-$-type offset layer 13 is formed on the side of the drain, and a heavily doped $p^+$-type buried layer 7 and an n-type layer 6 are formed only in a channel region and in a region on the side of the source. The lateral power MOS transistor has a breakdown voltage on the order of 20 V and satisfactory high-frequency characteristics.

This structure is formed by the following method. The substrate is formed by forming the p-type epitaxial layer 14 having an impurity concentration of $1\times10^{16}$ $cm^{-3}$ and a thickness of 3 μm by an epitaxial growth process on the $p^+$-type base substrate 15. After forming isolation regions 2 on the substrate by a LOCOS oxidation method, a gate electrode 3 and layers under the gate electrode 3 are formed by the same processes as those used for forming the gate electrode and the corresponding layers of the first embodiment. When forming the heavily doped $p^+$-type buried layer 7 and the n-type doped layer 6 by ion implantation, the drain region is covered with a photoresist mask. Then, the entire surface of the device forming region is doped with phosphorus in an impurity dose of $2.4\times10^{12}$ $cm^{-2}$ by ion implantation using the gate electrode 3 as a mask and ion energy of 110 keV to form an $n^-$-type offset layer 13. Then, an $n^+$-type source region 4a and an $n^+$-type drain region 4b are formed by 110 KeV and $2\times10^{15}$ $cm^{-2}$ phosphorus ion implantation with photoresist that covers the $n^-$-type offset layer 13. Then, the interlayer insulating film 8, via holes and metal wiring lines 9 are formed by the same processes as those carried out in fabricating the first embodiment to complete the structure shown in FIG. 10.

In this embodiment, since the $n^-$-type offset layer 13 has a breakdown voltage of 20 V, and the three-layer structure consisting of the lightly doped $p^-$-type doped layer 5, the n-type doped layer 6 and the heavily doped $p^+$-type buried layer 7 makes the depletion layer spread from the inversion layer, the subthreshold swing can be reduced to lower the threshold voltage to about 0.2 V, and the longitudinal electric field intensity in the interface of the gate insulating film can be reduced to enhance the carrier mobility. Therefore, the on-resistance of the lateral power MOS transistor in this embodiment is lower than the ordinary lateral power MOS transistor, and the lateral power MOS transistor in this embodiment has improved high-frequency characteristics.

The values specifying the thickness of the epitaxial layer and ion implantation conditions are only examples and are not limitative, and the design may be changed when necessary.

EXAMPLE 8

A MIS device in a eighth embodiment according to the present invention will be described with reference to FIG. 11. The MIS device in this embodiment is a vertical power MOS transistor of a structure shown in FIG. 11 in a sectional view. The vertical power MOS transistor in this embodiment is featured, as compared with an ordinary vertical power MOS transistor having a p-type channel region 25 and $n^+$-type source regions 4a formed on an $n^-$-on $n^+$-type substrate in a self-alignment method by using a gate electrode 3 as a mask, by an n-type doped layer 6 formed in a plane at a predetermined distance, such as 0.1 μm in this embodiment, from the surface of a channel region. The n-type doped layer 6 is sandwiched between p-type channel regions 25 and extends in a plane at a predetermined depth from the surface, and is formed in a thickness so that the n-type doped layer 6 will be depleted by the built-in potential of pn junctions formed between the n-type doped layer 6 and the overlying and the underlying p-type layer. The vertical power MOS transistor of this structure has a reduced on-resistance and satisfactory high-frequency characteristics.

The vertical power MOS transistor of this structure is fabricated by the following method. A substrate is formed by forming an $n^-$-type epitaxial layer 16 having, for example, an n-type impurity concentration of $1\times10^{16}$ $cm^{-3}$ and a thickness of 5 μm by epitaxial growth on an $n^+$-type base substrate 17. The substrate is doped with arsenic in an impurity dose of $4\times10^{12}$ $cm^{-2}$ by an ion implantation process using ion energy of 180 keV to form the n-type doped layer 6 of the same conductivity type as that of the source/drain regions at a depth on the order of 0.1 μm. After forming a gate oxide film 10 by thermal oxidation, the gate electrode 3 is formed by depositing a material for forming the gate electrode 3, such as polycrystalline silicon, by a CVD process in a film having a thickness of 0.4 μm, and dry-etching the film by a photolithographic etching process. Then, the p-type channel regions 25 having an impurity dose of $3\times10^{12}$ $cm^{-2}$ is formed by a boron ion implantation process using ion energy of 80 keV and a thermal diffusion process using a nitrogen atmosphere of 1000° C. and a process duration of 120 min. The p-type channel regions may be formed by oblique ion implantation to suppress the spread of impurity concentration distribution in the n-type doped layer 6 caused by the thermal diffusion process. Then, phosphorus is implanted in an impurity dose of $2\times10^{15}$ $cm^{-2}$ by ion implantation using ion energy of 110 keV to form the $n^+$-type source regions 4a. Then, the interlayer insulating film 8, the via holes and the metal wiring lines are formed to complete the structure shown in FIG. 11. The values specifying the thickness of the epitaxial layer and ion implantation conditions are only examples and not limitative, and the design may be changed when necessary.

In this embodiment, the n-type doped layer 6, of the same conductivity type as that of the source/drain regions, makes the depletion layer spread in the channel region when an inversion layer is formed and thereby the subthreshold swing is reduced. Therefore, the threshold voltage is about 0.2 V and the carrier mobility is enhanced. Thus, the vertical power MOS transistor in this embodiment has an on-resistance lower than the ordinary vertical power MOS transistor, and improved high-frequency characteristics.

Although the MIS devices in several preferred embodiments have been described, the present invention is not limited to those embodiments specifically described herein and many changes and variations may be made therein without departing the spirit and scope of the invention.

As is apparent form the foregoing description of the preferred embodiments, even in a miniaturized MIS device in accordance with the present invention, the channel region is formed in a three-layer structure consisting of the p⁻-type doped layer, the n-type doped layer and the p⁺-type doped layer so that the n-type doped layer is depleted by the built-in potential of the pn junctions respectively formed by the n-type doped layer and the two p-type doped layers. Accordingly, the leakage current is reduced because the subthreshold swing can be reduced, the threshold voltage can be lowered accordingly, the carrier mobility can be enhanced through the reduction of the electric field intensity in the interface of the gate insulating film, and the MIS device is able to operate at a high operating speed on a low supply voltage.

Since the subthreshold swing is reduced, the reduction rate of the drain current at a voltage not higher than the threshold voltage $V_{th}$ is large and hence the leakage current can be reduced. On the contrary, when the voltage is not lower than the threshold voltage $V_{th}$, the electric field intensity in the interface of the gate insulating film is not higher than half that of the electric field intensity in the conventional MIS device and, therefore, the carrier mobility is enhanced, the saturation current is 2.5 times that of the conventional MIS device, and the MIS device of the present invention has a high current driving ability.

What is claimed is:

1. In a MIS device comprising a pair of first doped layers of a second conductivity type forming source/drain regions in a semiconductor base structure of a first conductivity type, and a gate electrode formed in a region between the first doped layers of the second conductivity type on a gate insulating film formed on the semiconductor base structure, the improvement comprising:

a second doped layer of the first conductivity type formed in the surface of a channel region extending between the source/drain regions;

a third doped layer of the second conductivity type formed so as to underlie the second doped layer of the first conductivity type; and a fourth doped layer of the first conductivity type formed so as to underlie the third doped layer of the second conductivity type and having an impurity concentration higher than that of the semiconductor base structure, wherein an inversion layer channel formed when a voltage is applied to the gate electrode is a surface channel formed in the second doped layer of the first conductivity type underlying the gate insulating film, wherein the source/drain regions are separated from the third doped layer, respectively, and wherein the thickness of the third doped layer of the second conductivity type is determined so that the third doped layer of the second conductivity type is depleted by the built-in potential of a pn junction formed between the second doped layer of the first conductivity type and the third doped layer of the second conductivity type and that between the fourth doped layer of the first conductivity type and the third doped layer of the second conductivity type.

2. A MIS device according to claim 1, wherein a fifth doped layer of the first conductivity type having an impurity concentration higher than that of the semiconductor base structure is formed at a predetermined distance from at least one of the opposite ends of the channel region of the third doped layer of the second conductivity type.

3. A MIS device according to claim 1, wherein the fourth doped layer of the first conductivity type is formed so as to extend under the channel region and not to extend under the source/drain regions.

4. A MIS device according to claim 1, wherein the first conductivity type consists of one of an n-type and a p-type conductivity and the second conductivity consists of the other one of the n-type and p-type conductivity.

5. A MIS device according to claim 1, wherein the first conductivity type is p-type conductivity and the second conductivity type is n-type conductivity.

6. A MIS device according to claim 1, wherein said second doped layer has a junction depth greater than that of the first doped layers forming the source/drain regions.

7. A MIS device according to claim 6, wherein the first conductivity type consists of one of an n-type and a p-type conductivity and the second conductivity consists of the other one of the n-type and p-type conductivity.

8. A MIS device according to claim 6, wherein the first conductivity type is p-type conductivity and the second conductivity type is n-type conductivity.

9. In a MIS transistor device comprising a pair of first doped layers of a second conductivity type forming source/drain regions at a main surface in a semiconductor body of a first conductivity type, and a gate electrode formed, through a gate insulating film, on a region above a base layer of said semiconductor body between the first doped layers of the second conductivity type, the improvement comprising:

a second doped layer of the first conductivity type formed at said main surface in a channel region extending between the source/drain regions;

a third doped layer of the second conductivity type formed so as to underlie the second doped layer of the first conductivity type; and a fourth doped layer of the first conductivity type formed so as to underlie the third doped layer of the second conductivity type and having an impurity concentration higher than that of the base layer, wherein an inversion layer channel formed when a voltage is applied to the gate electrode is a main surface channel formed in the second doped layer of the first conductivity type underlying the gate insulating film, wherein the source/drain regions are separated from the third doped layer, respectively, and wherein the thickness of the third doped layer of the second conductivity type is determined so that the third doped layer of the second conductivity type is depleted by the built-in potential of a pn junction formed between the second doped layer of the first conductivity type and the third doped layer of the second conductivity type and that between the fourth doped layer of the first conductivity type and the third doped layer of the second conductivity type.

10. A MIS transistor device according to claim 9, wherein said semiconductor body constitutes a semiconductor substrate.

11. A MIS transistor device according to claim 10, wherein said second doped layer has a junction depth greater than that of the first doped layers forming the source/drain regions.

12. A MIS transistor device according to claim 10, wherein the first conductivity type consists of one of an n-type and a p-type conductivity and the second conductivity consists of the other one of the n-type and p-type conductivity.

13. A MIS transistor device according to claim 10, wherein the first conductivity type is p-type conductivity and the second conductivity type is n-type conductivity.

14. A MIS transistor device according to claim 11, wherein said fourth doped layer is substantially limited to a region in said semiconductor body beneath the channel region and between the source/drain regions.

15. A MIS transistor device according to claim 10, wherein said fourth doped layer is substantially limited to a region in said semiconductor body beneath the channel region and between the source/drain regions.

16. A MIS transistor device according to claim 11, wherein said fourth doped layer is extended to underlie the channel region and the source/drain regions.

17. A MIS transistor device according to claim 10, wherein said fourth doped layer is extended to underlie the channel region and the source/drain regions.

18. A MIS transistor device according to claim 9, wherein said base layer is a semiconductor substrate, and wherein the first through third doped layers are formed in an epitaxial layer, said epitaxial layer being constituted by said fourth semiconductor layer of the first conductivity type.

19. A MIS transistor device according to claim 18, wherein said second doped layer has a junction depth greater than that of the first doped layers forming the source/drain regions.

20. A MIS transistor device according to claim 19, wherein said fourth doped layer is extended to underlie the channel region and the source/drain regions.

21. A MIS transistor device according to claim 18, wherein said fourth doped layer is extended to underlie the channel region and the source/drain regions.

22. A MIS transistor device according to claim 18, wherein the first conductivity type consists of one of an n-type and a p-type conductivity and the second conductivity consists of the other one of the n-type and p-type conductivity.

23. A MIS transistor device according to claim 18, wherein the first conductivity type is p-type conductivity and the second conductivity type is n-type conductivity.

24. A MIS device constituted by at least one pair of complementary MIS transistors formed in respectively separate regions of a common semiconductor body, wherein each transistor has upper, first level doped layers for forming source/drain regions at a main surface of said semiconductor body, and a gate electrode formed, through a gate insulating film, on a region above a base layer in a corresponding portion of said semiconductor body between the source/drain regions of that MISFET, the improvement comprising:

(i) in an isolated portion associated with a first transistor:
a second doped layer of a first conductivity type formed at said main surface of a channel region extending between the source/drain regions, said source/drain regions having a second conductivity type;
a third doped layer of the second conductivity type formed so as to underlie the second doped layer; and
a fourth doped layer of the first conductivity type formed so as to underlie the third doped layer and having an impurity concentration higher than that of said base layer, wherein an inversion layer channel formed when a voltage is applied to the gate electrode is a main surface channel formed in the second doped layer, wherein the source/drain regions are separated from the third doped layer, respectively, and wherein the thickness of the third doped layer is determined so that the third doped layer is depleted by the built-in potential of a pn junction formed between the second doped layer and the third doped layer and that between the fourth doped layer and the third doped layer, and (ii) in an isolated portion associated with a second, complementary MIS transistor:
a fifth doped layer of the second conductivity type formed at said main surface of a channel region extending between the source/drain regions, said source/drain regions having the first conductivity type;
a sixth doped layer of the first conductivity type formed so as to underlie the fifth doped layer; and
a seventh doped layer of the second conductivity type formed so as to underlie the sixth doped layer, wherein an inversion layer channel formed when a voltage is applied to the gate electrode is a main surface channel formed in the fifth doped layer, wherein the source/drain regions are separated from the sixth doped layer, respectively, and wherein the thickness of the sixth doped layer is determined so that the sixth doped layer is depleted by the built-in potential of a pn junction formed between the fifth doped layer and the sixth doped layer and that between the seventh doped layer and the sixth doped layer.

25. A MIS device according to claim 24, wherein said first and second MIS transistors are NMOS and PMOS transistors, respectively.

26. A MIS device according to claim 24, wherein the first conductivity type consists of one of an n-type and a p-type conductivity and the second conductivity consists of the other one of the n-type and p-type conductivity.

* * * * *